(12) United States Patent
Huang

(10) Patent No.: US 11,024,679 B2
(45) Date of Patent: Jun. 1, 2021

(54) COLOR FILTER SUBSTRATE HAVING A FILTER LAYER DISPOSED ON QUANTUM DOT LAYER

(71) Applicant: Shenzhen China Star Optoelectronics Technology Co., Ltd., Shenzhen (CN)

(72) Inventor: Hui Huang, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 359 days.

(21) Appl. No.: 16/307,136

(22) PCT Filed: Sep. 14, 2018

(86) PCT No.: PCT/CN2018/105655
§ 371 (c)(1),
(2) Date: Dec. 5, 2018

(87) PCT Pub. No.: WO2019/214125
PCT Pub. Date: Nov. 14, 2019

(65) Prior Publication Data
US 2021/0083010 A1   Mar. 18, 2021

(30) Foreign Application Priority Data

May 9, 2018 (CN) .......................... 201810439402.X

(51) Int. Cl.
*H01L 51/00* (2006.01)
*H01L 33/00* (2010.01)
(Continued)

(52) U.S. Cl.
CPC .......... *H01L 27/322* (2013.01); *H01L 27/326* (2013.01); *H01L 27/3246* (2013.01); *H01L 27/3283* (2013.01); *H01L 51/5253* (2013.01)

(58) Field of Classification Search
CPC ............... H01L 27/322; H01L 27/3246; H01L 27/3283; H01L 51/5253
See application file for complete search history.

(56) References Cited

U.S. PATENT DOCUMENTS

2017/0346008 A1* 11/2017 Xu .................... G02F 1/133621
2018/0182814 A1*  6/2018 Kim ...................... H01L 27/322

FOREIGN PATENT DOCUMENTS

CN     103235442 A     8/2013
CN     103472513 A     12/2013
(Continued)

*Primary Examiner* — Alonzo Chambliss
(74) *Attorney, Agent, or Firm* — Leong C. Lei

(57) ABSTRACT

The present invention teaches a CF substrate, its manufacturing method, and a WOLED display device. The CF substrate includes a substrate, a pixel definition layer, and multiple filter patterns. The pixel definition layer has multiple openings, each corresponding to a sub-pixel area of the substrate. Each filter pattern is disposed on the substrate inside an opening of the pixel definition layer, and includes a quantum dot layer and a filter layer sequentially formed on the substrate. The CF substrate requires a single lithographic process to form the openings. The quantum dot layers and filter layers of the filter patterns are then formed by solution film formation in the openings, effectively simplifying the manufacturing process and enhancing the production efficiency. Applying the CF substrate to a WOLED display device also enhances the lighting efficiency, color gamut, and product quality of the WOLED display device.

10 Claims, 5 Drawing Sheets

(51) Int. Cl.
*H01L 31/0232* (2014.01)
*H01L 21/00* (2006.01)
*H01L 51/40* (2006.01)
*H01L 27/32* (2006.01)
*H01L 51/52* (2006.01)

(56) References Cited

FOREIGN PATENT DOCUMENTS

| CN | 105607344 A | 5/2016 |
| CN | 106784406 A | 5/2017 |

* cited by examiner

COLOR FILTER SUBSTRATE HAVING A FILTER LAYER DISPOSED ON QUANTUM DOT LAYER

FIELD OF THE INVENTION

The present invention is generally related to the field of display technology, and more particularly to a color filter (CF) substrate, its manufacturing method, and a white organic light emitting diode (WOLED) display device.

BACKGROUND OF THE INVENTION

Organic light emitting diode (OLED) display device, also called electroluminescence display device, is an emerging flat panel display device. It is deemed as a promising display device by the industry due to its simplified manufacturing, low cost, low power consumption, high brightness, wide operation temperature range, reduced thickness and weight, short response time, capability to fulfill flexible, large-dimension, full-color display, and easy integration with IC driver.

According to its driver mechanism, an OLED display device may be categorized as a passive matrix OLED (PMOLED) display device using direct addressing or an active matrix OLED (AMOLED) display device using thin film transistor (TFT) addressing. AMOLED involves pixels in an array, and is an active type display device. AMOLED display device has high lighting efficiency, and is usually employed in a high-resolution, large-dimension display device.

An OLED device generally includes a substrate, an anode on the substrate, a hole injection layer (HIL) on the anode, a hole transport layer (HTL) on the hole injection layer, a lighting material layer on the hole transport layer, an electron transport layer (ETL) on the lighting material layer, an electron injection layer (EIL) on the electron injection layer, and a cathode on the electron injection layer. The operation principle of the OLED device is that light is produced by the injection and combination of electrons and holes as semiconductor and organic lighting material are driven by electrical field. Specifically, an OLED device often uses indium tin oxide (ITO) pixel electrode as the anode and metallic electrode as cathode. Under a specific voltage, electrons and holes are injected into the electron injection layer and the hole injection layer from the anode and cathode. Electrons and holes then move to the lighting material layer through the electron transport layer and the hole transport layer. Electrons and holes meet in the lighting material layer to form excitons and excite lighting molecules. The latter emits visible light through radiation relaxation.

Existing OLED display devices often adopt a structure with a while OLED (WOLED) substrate integrated with a color filter (CF) substrate. The CF substrate includes multiple red, green, and blue color resists. Colored light is produced as white light from the WOLED substrate is filtered by the red, green, and blue color resists of the CF substrate, thereby achieving color display. Common manufacturing method for the CF substrate involves a complex process using evaporation and repeated lithographic steps to form color resist units. On the other hand, non-evaporation process such as ink printing is not mature yet. Furthermore, for high-resolution WOLED display device, the pixels are densely arranged and color mixing problem is difficult to overcome, compromising the display quality.

SUMMARY OF THE INVENTION

An objective of the present invention is to provide a CF substrate where it is simple to manufacture and, when it is applied to a WOLED display device, it enhances the WOLED display device's lighting efficiency, color gamut, and product quality.

Another objective of the present invention is to provide a CF substrate manufacturing method where it is simple to operate and the manufactured CF substrate, when it is applied to a WOLED display device, it enhances the WOLED display device's lighting efficiency, color gamut, and product quality.

Yet another objective of the present invention is to provide a WOLED display device having enhanced lighting efficiency and color gamut.

To achieve the objective, the present invention teaches a CF substrate, comprising the following components.

A substrate configured with a plurality of pixel areas.

A pixel definition layer disposed on the substrate having a plurality of openings, each corresponding to a sub-pixel area.

A plurality of filter patterns, each comprising a quantum dot layer and a filter layer sequentially disposed on the substrate within an opening of the pixel definition layer, where the quantum dot layer comprises a quantum dot material.

An encapsulation film disposed on the substrate covering the pixel definition layer and the filter patterns.

Each filter pattern further comprises a first anchor layer disposed between the quantum dot layer and the substrate, and a second anchor layer disposed between the filter layer and the quantum dot layer.

The first and second anchor layers comprises a dilute acid.

The pixel definition layer is made of a photoresist.

The quantum dot layer and the filter layer of each filter pattern are formed by solution film formation within an opening of the pixel definition layer.

The present invention also provides a CF substrate manufacturing method comprising the following steps.

Providing a substrate configured with a plurality of sub-pixel areas.

forming a pixel definition layer on the substrate by coating a photoresist on the substrate and conducting exposure and development to the photoresist, where the pixel definition layer has a plurality of openings, each corresponding to a sub-pixel area;

forming a quantum dot layer in each opening by solution film formation, where each quantum dot layer comprises a quantum dot material; and Forming a filter layer on a quantum dot layer in each opening of the pixel definition layer using solution film formation, thereby obtaining a filter pattern in each opening.

Forming an encapsulation film on the substrate covering the pixel definition layer and the filter patterns.

Before forming a quantum dot layer in each opening of the pixel definition layer, forming a first anchor layer in each opening of the pixel definition layer.

before forming a filter layer on a quantum dot layer in each opening of the pixel definition layer, forming a second anchor layer on the quantum dot layer in each opening of the pixel definition layer; and After obtaining the filter patterns, curing the filter patterns by drying and baking.

The first and second anchor layers comprises a dilute acid.

The solution film formation is by inkjet printing or coating.

The present invention also provides WOLED display device, comprising a CF substrate described above.

The advantages of the present invention are as follows. The CF substrate of the present invention includes a substrate, a pixel definition layer, and multiple filter patterns. The pixel definition layer has multiple openings, each corresponding to a sub-pixel area of the substrate. Each filter pattern is disposed on the substrate inside an opening of the pixel definition layer, and includes a quantum dot layer and a filter layer sequentially formed on the substrate. The CF substrate of the present invention requires a single lithographic process to form the openings. The quantum dot layers and filter layers of the filter patterns are then formed by solution film formation in the openings, effectively simplifying the manufacturing process and enhancing the production efficiency. Applying the CF substrate to a WOLED display device also enhances the lighting efficiency, color gamut, and product quality of the WOLED display device. The CF substrate of the present invention has a simplified manufacturing method and the obtained CF substrate applied to a WOLED display device may enhance the lighting efficiency, color gamut, and product quality of the WOLED display device. The WOLED display device of the present invention has enhanced lighting efficiency and color gamut.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
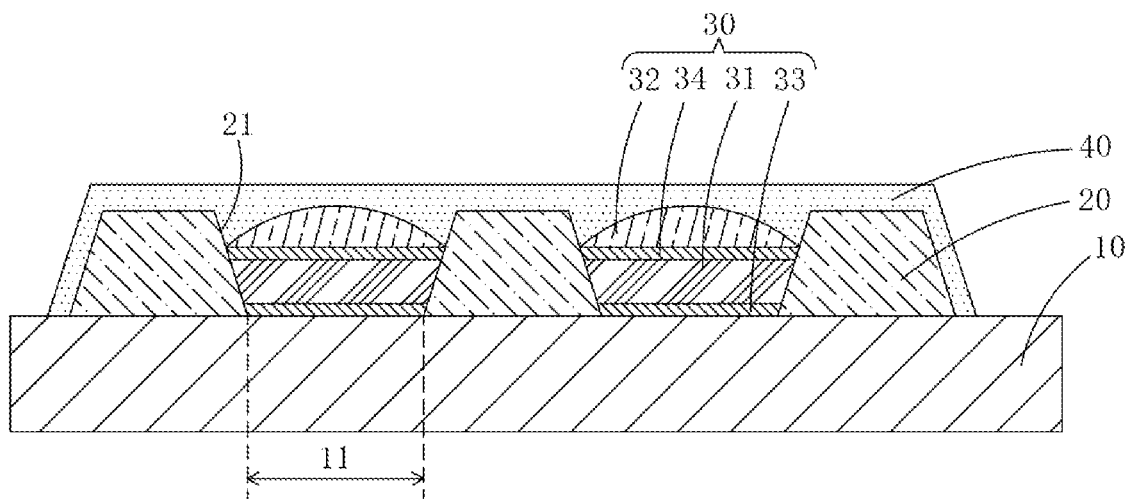
FIG. 1 is a structural schematic diagram showing a CF substrate according to an embodiment of the present invention.

As shown in FIG. 1, the present invention teaches a color filter (CF) substrate, including a substrate 10, a pixel definition layer 20, multiple filter patterns 30, and an encapsulation film 40.

Multiple sub-pixel areas 11 are configured on the substrate 10. The pixel definition layer 20 is disposed on the substrate 10, and includes multiple openings 21, each corresponding to a sub-pixel area 11. Each filter pattern 30 is disposed on the substrate 10 within an opening 21 of the pixel definition layer 20, and includes a quantum dot layer 31 and a filter layer 32 sequentially disposed on the substrate 10. The quantum dot layer 31 includes a quantum dot material. The encapsulation film 40 is disposed on the substrate 10, covering the pixel definition layer 20 and filter patterns 30.

Specifically, the substrate 10 is made of a transparent material, such as glasses.

Specifically, the quantum dot layer 31 and the filter layer 32 are formed in an opening 21 of the pixel definition layer 20 using solution film formation. Preferably, the solution film formation is by inkjet printing or coating.

Specifically, each sub-pixel area 11 may be a red sub-pixel area, a green sub-pixel area, and a blue sub-pixel area. For a filter patter 30 in an opening 21 corresponding to a red sub-pixel area, its quantum dot layer 31 has quantum dot material that may excite red light and its filter layer 32 may filter white light to emit red light. For a filter patter 30 in an opening 21 corresponding to a green sub-pixel area, its quantum dot layer 31 has quantum dot material that may excite green light and its filter layer 32 may filter white light to emit green light. For a filter patter 30 in an opening 21 corresponding to a blue sub-pixel area, its quantum dot layer 31 has quantum dot material that may excite blue light and its filter layer 32 may filter white light to emit blue light.

Specifically, the quantum dot material may be one commonly used by existing technology. Preferably, it is a metal oxide, such as CdS.

Specifically, as shown in FIG. 1, each filter pattern 30 further includes a first anchor layer 33 disposed between the quantum dot layer 31 and the substrate 10, and a second anchor layer 34 disposed between the filter layer 32 and the quantum dot layer 31. Furthermore, the first and second anchor layers 33 and 34 include a dilute acid that is an inorganic acid such as hydrochloric acid. Due to the hydrogen ions within the dilute acid, the first anchor layer 33's hydrogen ions anchor and thereby enhance the bonding between the quantum dot layer 31 and the substrate 10, and the second anchor layer 34's hydrogen ions anchor and thereby enhance the bonding between the quantum dot layer 31 and the filter layer 32.

Specifically, the pixel definition layer 20 is made of photoresist and therefore the openings 21 may be readily obtained through exposure and development to a layer of photoresist.

Preferably, the openings 21 have a depth between 1 and 5 mm.

Preferably, the encapsulation film 40 has a thickness between 1 and 5 mm.

Specifically, the encapsulation film 40 is made of silicon oxide or silicon nitride.

It should be noted that, compared to the CF substrate by the prior art that requires multiple lithographic processes, the CF substrate of the present invention has a simplified manufacturing process and therefore an improved production efficiency. The present invention has a pixel definition layer 20 on the substrate 10, and the pixel definition layer 20 has openings 21 penetrating the pixel definition layer 20 and corresponding to the sub-pixel areas 11. Then, filter patters 30 corresponding to the sub-pixel areas 11 may be readily obtained by sequentially disposing quantum dot layers 31 and filter layers 32 in the openings 21. The openings 21 may be formed using a single lithographic process on the pixel definition layer 20. The subsequent formation of the filter patterns 30 may adopt solution film formation. When a CF substrate of the present invention is applied to a WOLED display device, the CF substrate has its side with the filter patterns 30 facing the side of the WOLED substrate having the WOLED layer. White light from the WOLED layer passes first through the encapsulation films 40, and then trough the filter layers 32. Red, green, and blue lights filtered out by the filter layers 32 then reach the quantum dot layers 31 to excite the quantum dot material, producing light of high color purity. The WOLED display device therefore has enhanced lighting efficiency, color gamut, and product quality. On the other hand, the encapsulation film 40 also prevents external moist and air from permeating into the filter patterns 30. The CF substrate as such may have an extended life and better reliability. The encapsulation film 40 has little impact to lighting efficiency as it has a high transmittance.

Figure 2:
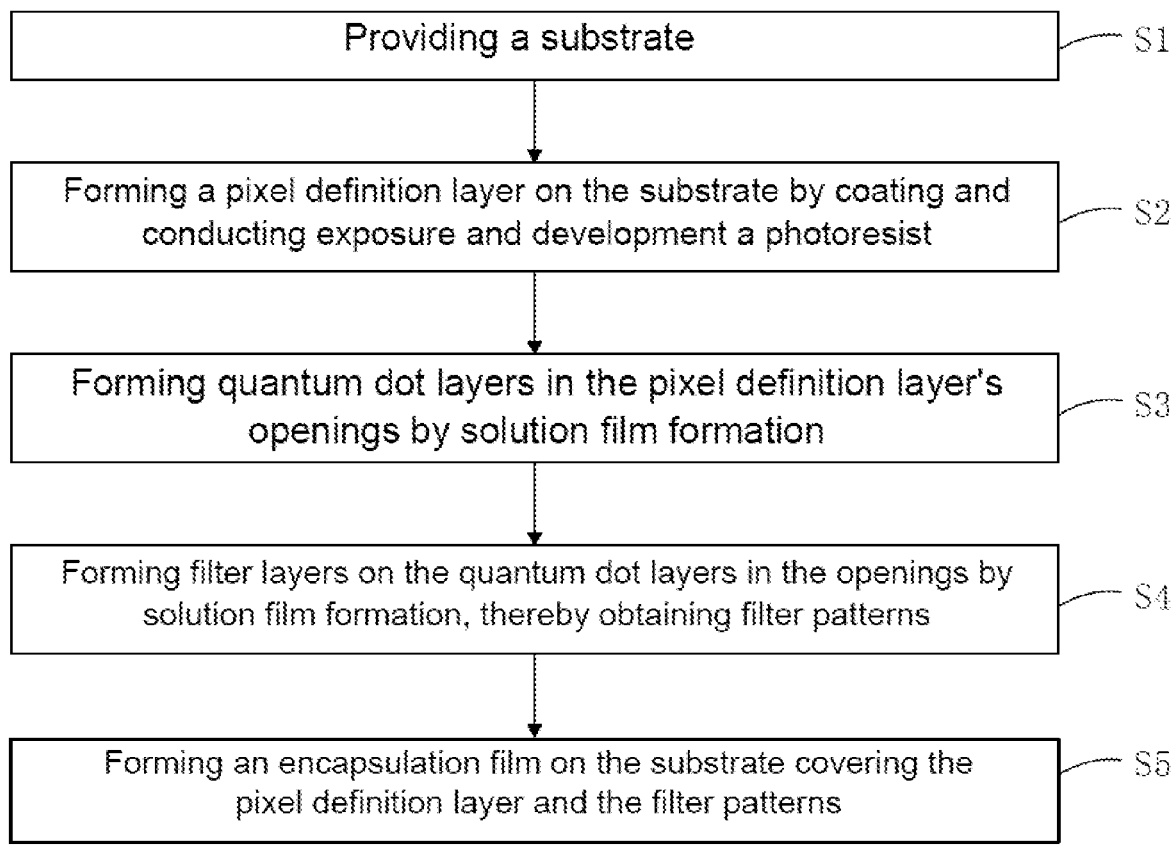
FIG. 2 is a flow diagram showing a CF substrate manufacturing method according to an embodiment of the present invention.

As shown in FIG. 2, based on a same inventive idea, the present invention also teaches a manufacturing method for the above described CF substrate. The method includes the following steps.

Figure 3:
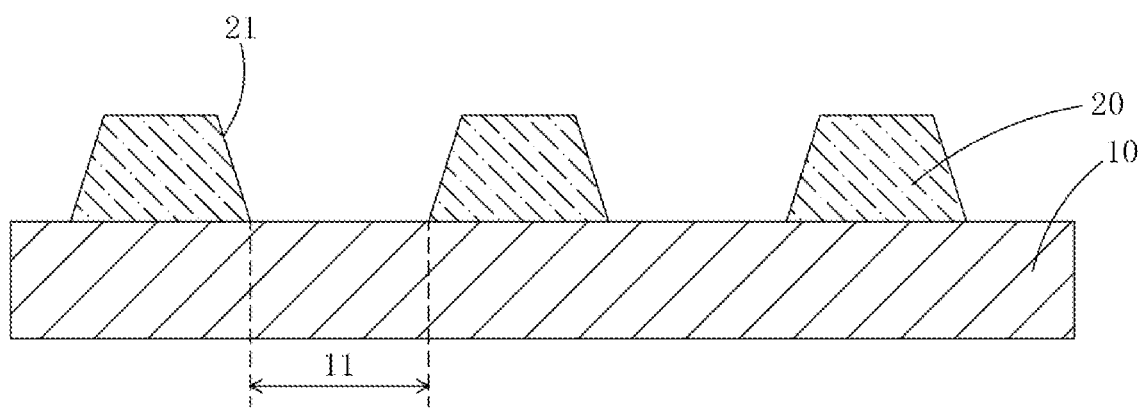
FIG. 3 is a schematic diagram showing the manufacturing of a CF substrate in steps S1 and S2 of the manufacturing method of FIG. 2.

Step S1: as shown in FIG. 3, providing a substrate 10, where the substrate 10 is configured with multiple sub-pixel areas 11.

Specifically, the substrate 10 is made of a transparent material, such as glasses.

Specifically, each sub-pixel area 11 is one of a red sub-pixel area, a green sub-pixel area, and a blue sub-pixel area.

Step S2: As shown in FIG. 3, forming a pixel definition layer 20 on the substrate 10 by first coating a photoresist on the substrate 10, and then conducting exposure and development. The pixel definition layer 20 has multiple openings 21, each corresponding to a sub-pixel area 11.

Preferably, the openings 21 have a depth between 1 and 5 mm.

Figure 4:
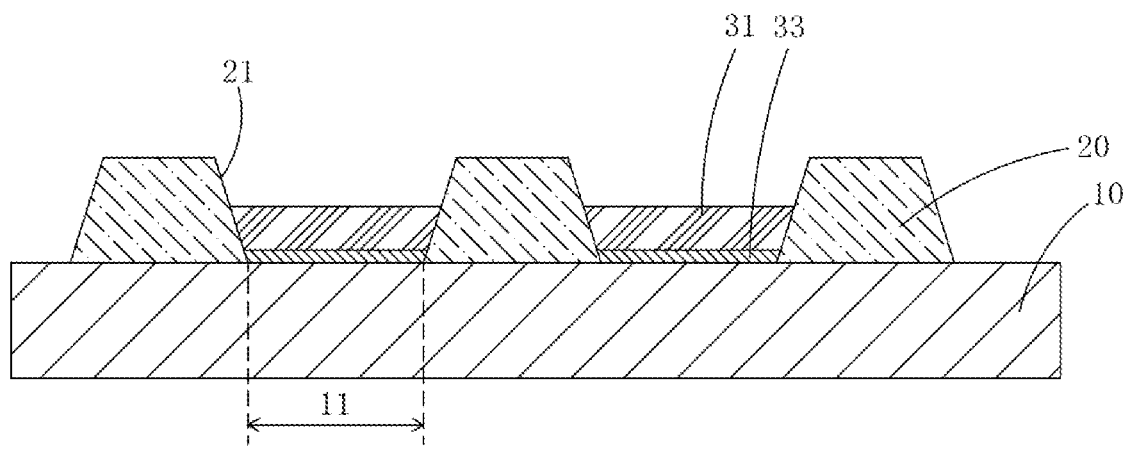
FIG. 4 is a schematic diagram showing the manufacturing of a CF substrate in step S3 of the manufacturing method of FIG. 2.

Step S3: As shown in FIG. 4, forming a quantum dot layer 31 in each opening 21 by solution film formation. Each quantum dot layer 31 includes quantum dot material.

Specifically, the solution film formation is by inkjet printing or coating.

Specifically, the quantum dot layer 31 in an opening 21 corresponding to a red sub-pixel area has quantum dot material that excites red light, the quantum dot layer 31 in an opening 21 corresponding to a green sub-pixel area has quantum dot material that may excite green light, and the quantum dot layer 31 in an opening 21 corresponding to a blue sub-pixel area has quantum dot material that may excite blue light.

Specifically, the quantum dot material is one commonly used by existing technology. Preferably, it is a metal oxide, such as CdS.

Specifically, in step S3, before forming a quantum dot layer 31 in each opening 21 of the pixel definition layer 20, a first anchor layer 33 is formed in each opening 21 of the pixel definition layer 20.

Preferably, the first anchor layer 33 includes a dilute acid that is an inorganic acid such as hydrochloric acid. The first anchor layer 33 is formed in the opening 21 by solution film formation using dilute acid solution. Due to the hydrogen ions within the dilute acid, the first anchor layer 33's hydrogen ions anchor and thereby enhance the bonding between the quantum dot layer 31 and the substrate 10.

Figure 5:
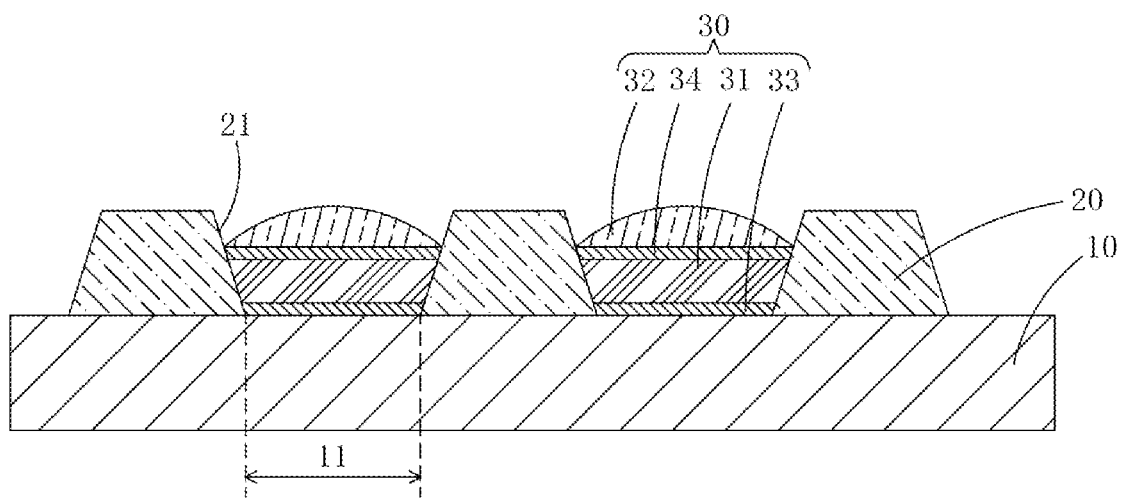
FIG. 5 is a schematic diagram showing the manufacturing of a CF substrate in step S4 of the manufacturing method of FIG. 2.

Step S4: as shown in FIG. 5, forming a filter layer 32 on a quantum dot layer 31 in each opening 21 of the pixel definition layer 20 using solution film formation, thereby obtaining a filter pattern 30 in each opening 21.

Specifically, the solution film formation of step S4 is by inkjet printing or coating.

Specifically, a filter layer 32 in an opening 21 corresponding to a red sub-pixel area filters white light to emit red light, a filter layer 32 in an opening 21 corresponding to a green sub-pixel area filters white light to emit green light, and a filter layer 32 in an opening 21 corresponding to a blue sub-pixel area filters white light to emit blue light.

Specifically, in step S4, before forming a filter layer 32 on a quantum dot layer 31 in each opening 21 of the pixel definition layer 20, a second anchor layer 34 is formed on the quantum dot layer 31 in each opening 21 of the pixel definition layer 20.

Preferably, the second anchor layer 34 includes a dilute acid that is an inorganic acid such as hydrochloric acid. The second anchor layer 34 is formed in the opening 21 by solution film formation using dilute acid solution. Due to the hydrogen ions within the dilute acid, the second anchor layer 34's hydrogen ions anchor and thereby enhance the bonding between the quantum dot layer 31 and the filter layer 32.

Specifically, after finishing step S4, the filter patterns 30 are further cured by drying and baking.

Step S5: as shown in FIG. 1, forming an encapsulation film 40 on the substrate 10 covering the pixel definition layer 20 and the filter patterns 30.

It should be noted that, compared to the prior art that requires multiple lithographic processes, the CF substrate manufacturing method of the present invention has a simplified process and therefore an improved production efficiency. The openings 21 may be formed using a single lithographic process on the pixel definition layer 20. The subsequent formation of the filter patterns 30 may adopt solution film formation. When a CF substrate of the present invention is applied to a WOLED display device, the CF substrate has its side with the filter patterns 30 facing the side of the WOLED substrate having the WOLED layer. White light from the WOLED layer passes first through the encapsulation films 40, and then trough the filter layers 32. Red, green, and blue lights filtered out by the filter layers 32 then reach the quantum dot layers 31 to excite the quantum dot material, producing light of high color purity. The WOLED display device therefore has enhanced lighting efficiency, color gamut, and product quality. On the other hand, the encapsulation film 40 also prevents external moist and air from permeating into the filter patterns 30. The CF substrate as such may have an extended life and better reliability. The encapsulation film 40 has little impact to lighting efficiency as it has a high transmittance.

Based on a same inventive idea, the present invention also teaches a WOLED display device, including a CF substrate described above, a WOLED substrate, and an encapsulation adhesive (such as an UV curing adhesive) joining the WOLED substrate and the CF substrate. The WOLED substrate has a structure commonly adopted by the WOLED substrate in the existing WOLED display devices, including an array substrate and a WOLED layer disposed on the array substrate. The WOLED substrate has its side with the WOLED layer facing the side of the CF substrate with the filter patterns 30. Encapsulation adhesive is then applied outside the encapsulation film 40 to join the array substrate of the WOLED substrate and the substrate of the CF substrate together. The encapsulation film 40 therefore does not interfere the adhesion between the WOLED substrate and the CF substrate. The WOLED display device of the present invention, by using a CF substrate described above, has simplified manufacturing, enhanced lighting efficiency, color gamut, and product quality.

As described above, the CF substrate of the present invention includes a substrate, a pixel definition layer, and multiple filter patterns. The pixel definition layer has multiple openings, each corresponding to a sub-pixel area of the substrate. Each filter pattern is disposed on the substrate inside an opening of the pixel definition layer, and includes a quantum dot layer and a filter layer sequentially formed on the substrate. The CF substrate of the present invention requires a single lithographic process to form the openings. The quantum dot layers and filter layers of the filter patterns are then formed by solution film formation in the openings, effectively simplifying the manufacturing process and enhancing the production efficiency. Applying the CF substrate to a WOLED display device also enhances the lighting efficiency, color gamut, and product quality of the WOLED display device. The CF substrate of the present invention has a simplified manufacturing method and the obtained CF substrate applied to a WOLED display device may enhance the lighting efficiency, color gamut, and product quality of the WOLED display device. The WOLED display device of the present invention has enhanced lighting efficiency and color gamut.

Above are embodiments of the present invention, which does not limit the scope of the present invention. Any equivalent amendments within the spirit and principles of the embodiment described above should be covered by the protected scope of the invention.

What is claimed is:

1. A color filter (CF) substrate, comprising
   a substrate configured with a plurality of pixel areas;
   a pixel definition layer disposed on the substrate having a plurality of openings, each corresponding to a sub-pixel area; and
   a plurality of filter patterns, each comprising a quantum dot layer and a filter layer sequentially disposed on the substrate within an opening of the pixel definition layer, where the quantum dot layer comprises a quantum dot material.

2. The CF substrate according to claim 1, further comprising an encapsulation film disposed on the substrate covering the pixel definition layer and the filter patterns.

3. The CF substrate according to claim 2, wherein the first and second anchor layers comprises a dilute acid; and the pixel definition layer is made of a photoresist.

4. The CF substrate according to claim 1, wherein each filter pattern further comprises a first anchor layer disposed between the quantum dot layer and the substrate, and a second anchor layer disposed between the filter layer and the quantum dot layer.

5. The CF substrate according to claim 1, wherein the quantum dot layer and the filter layer of each filter pattern are formed by solution film formation within an opening of the pixel definition layer.

6. A WOLED display device, comprising the CF substrate as claimed in claim 1.

7. A CF substrate manufacturing method, comprising
   providing a substrate configured with a plurality of sub-pixel areas;
   forming a pixel definition layer on the substrate by coating a photoresist on the substrate and conducting exposure and development to the photoresist, where the pixel definition layer has a plurality of openings, each corresponding to a sub-pixel area;
   forming a quantum dot layer in each opening by solution film formation, where each quantum dot layer comprises a quantum dot material; and
   forming a filter layer on the quantum dot layer in each opening of the pixel definition layer using solution film formation, thereby obtaining a filter pattern in each opening.

8. The CF substrate manufacturing method according to claim 7, further comprising the steps of: after obtaining the filter patterns, forming an encapsulation film on the substrate covering the pixel definition layer and the filter patterns;
   before forming the quantum dot layer in each opening of the pixel definition layer, forming a first anchor layer in each opening of the pixel definition layer;
   before forming the filter layer on the quantum dot layer in each opening of the pixel definition layer, forming a second anchor layer on the quantum dot layer in each opening of the pixel definition layer; and
   after obtaining the filter patterns, curing the filter patterns by drying and baking.

9. The CF substrate according to claim 8, wherein the first and second anchor layers comprises a dilute acid.

10. The CF substrate according to claim 7, wherein the solution film formation is by inkjet printing or coating.

* * * * *